US008442240B2

(12) United States Patent
Hanai et al.

(10) Patent No.: US 8,442,240 B2
(45) Date of Patent: May 14, 2013

(54) SOUND PROCESSING APPARATUS, SOUND PROCESSING METHOD, AND SOUND PROCESSING PROGRAM

(75) Inventors: Saki Hanai, Tokyo (JP); Mitsuhiro Suzuki, Saitama (JP)

(73) Assignee: Sony Corporation, Tokyo (JP)

( * ) Notice: Subject to any disclaimer, the term of this patent is extended or adjusted under 35 U.S.C. 154(b) by 298 days.

(21) Appl. No.: 12/901,083

(22) Filed: Oct. 8, 2010

(65) Prior Publication Data

US 2011/0091050 A1 Apr. 21, 2011

(30) Foreign Application Priority Data

Oct. 15, 2009 (JP) ............................... P2009-238366

(51) Int. Cl.
*H04B 15/00* (2006.01)
*H03G 5/00* (2006.01)
*H03F 99/00* (2009.01)

(52) U.S. Cl.
USPC ............................. 381/94.1; 381/98; 381/120

(58) Field of Classification Search .................... 381/17, 381/94.4, 94.1, 98, 120
See application file for complete search history.

(56) References Cited

U.S. PATENT DOCUMENTS

| | | | | |
|---|---|---|---|---|
| 8,260,608 | B2 * | 9/2012 | Opitz et al. | 704/205 |
| 2008/0069364 | A1 * | 3/2008 | Itou et al. | 381/17 |
| 2009/0052691 | A1 | 2/2009 | Tatsumi | |
| 2009/0222258 | A1 * | 9/2009 | Fukuda et al. | 704/203 |

FOREIGN PATENT DOCUMENTS

| | | |
|---|---|---|
| JP | 2009-49921 | 3/2009 |

* cited by examiner

*Primary Examiner* — Brian Ensey
*Assistant Examiner* — Norman Yu
(74) *Attorney, Agent, or Firm* — Finnegan Henderson Farabow Garrett & Dunner LLP

(57) ABSTRACT

A sound processing apparatus includes a power spectrum operation unit obtaining a power spectrum of an audio signal, an envelope component removal unit removing an envelope component of the power spectrum and generating a signal characteristic that represents a peakness of the power spectrum, a filter characteristic calculation unit calculating a filter characteristic suppressing the signal characteristic by using the signal characteristic, and a suppress filter filtering the audio signal by using the filter characteristic.

19 Claims, 9 Drawing Sheets

SOUND PROCESSING APPARATUS, SOUND PROCESSING METHOD, AND SOUND PROCESSING PROGRAM

BACKGROUND OF THE INVENTION

1. Field of the Invention

The present invention relates to a sound processing apparatus, a sound processing method, and a sound processing program, and more particularly to a sound processing apparatus, a sound processing method, and a sound processing program that can suppress howling with high accuracy.

2. Description of the Related Art

When sound collected by a microphone is amplified by an amplifier and then output from a public-address system such as a speaker, the output sound propagates through the air and is fed back to the microphone to form a closed loop. Depending on the condition such as volume or the position of each component, the amplitude of a specific frequency of an audio signal increases gradually, causing oscillation called howling.

A method of automatically suppressing howling is to detect the frequency (referred to below as the howling frequency) at which howling occurs by frequency analysis and reduce the gain of the howling frequency by creating a plurality of notch filters corresponding to the howling frequency (see, for example, Japanese Unexamined Patent Application Publication No. 2009-49921).

SUMMARY OF THE INVENTION

However, since a threshold is used to detect the howling frequency, if the threshold is low, a response to howling is fast, but detection error of the howling frequency is likely to occur and sound quality may be degraded.

If the threshold is high, detection error of the howling frequency reduces and sound quality is improved, but howling is suppressed after occurrence of howling because a response to howling is slow.

For the howling frequency incorrectly detected or the howling frequency at which howling no longer occurs, a notch filter can be released to suppress degradation in sound quality, but the control for this purpose is difficult.

As described above, it is difficult for the method of the related art to suppress howling with high accuracy.

It is desirable to suppress howling at high accuracy.

According to an embodiment of the present invention, there is provided a sound processing apparatus including a power spectrum operation means for obtaining a power spectrum of an audio signal, an envelope component removal means for removing an envelope component of the power spectrum and generating a signal characteristic that represents a peakness of the power spectrum, a filter characteristic calculation means for calculating a filter characteristic suppressing the signal characteristic by using the signal characteristic, and a suppress filter filtering the audio signal by using the filter characteristic.

A sound processing method and a sound processing program according to an embodiment of the present invention correspond to the sound processing apparatus according to the embodiment of the present invention.

In the embodiment of the present invention, a power spectrum of the audio signal is obtained, an envelope component of the power spectrum is removed, a signal characteristic that represents a peakness of the power spectrum is generated, a filter characteristic for suppressing the signal characteristic is calculated with the signal characteristic, and a sound characteristic is filtered with the filter characteristic.

According to the embodiment of the present invention, howling can be suppressed at high accuracy.

DESCRIPTION OF THE PREFERRED EMBODIMENT

Embodiment

Structure Example of an Embodiment of a Sound Processing Apparatus

Figure 1:
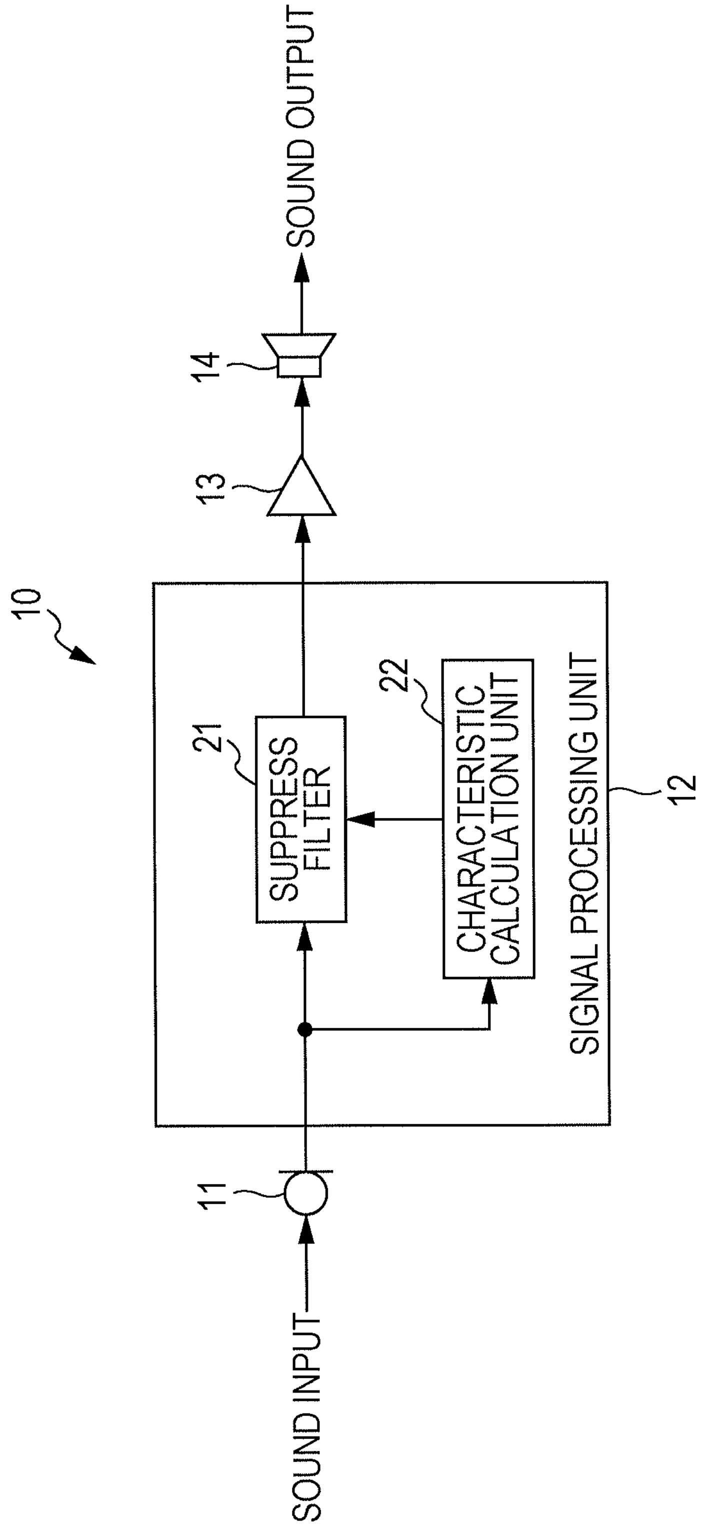
FIG. 1 is a block diagram showing a structure example of a sound processing apparatus according to an embodiment of the present invention.

FIG. 1 is a block diagram showing a structure example of a sound processing apparatus according to an embodiment of the present invention.

The sound processing apparatus 10 in FIG. 1 includes a microphone 11, a signal processing unit 12, amplifier 13, and speaker 14; sound input to the microphone 11 is amplified by suppressing howling and then output from the speaker 14.

Specifically, the microphone 11 of the sound processing apparatus 10 collects ambient sound and supplied an audio signal of the sound to the signal processing unit 12.

The signal processing unit 12 includes a suppress filter 21 and a characteristic calculation unit 22. The suppress filter 21 filters the audio signal supplied from the microphone 11 using a filter characteristic supplied from the characteristic calculation unit 22, and supplies the audio signal to the amplifier 13.

The characteristic calculation unit 22 calculates the filter characteristic of the suppress filter 21 using the audio signal supplied from the microphone 11, and supplies the filter characteristic to the suppress filter 21. This updates the suppress filter 21. Details on the characteristic calculation unit 22 will be described with reference to FIG. 2 shown later.

The amplifier 13 amplifies the audio signal supplied from the suppress filter 21 and supplies the audio signal to the speaker 14. The speaker 14 outputs sound corresponding to the audio signal supplied from the amplifier 13.

[Detailed Structure Example of the Characteristic Calculation Unit]

Figure 2:
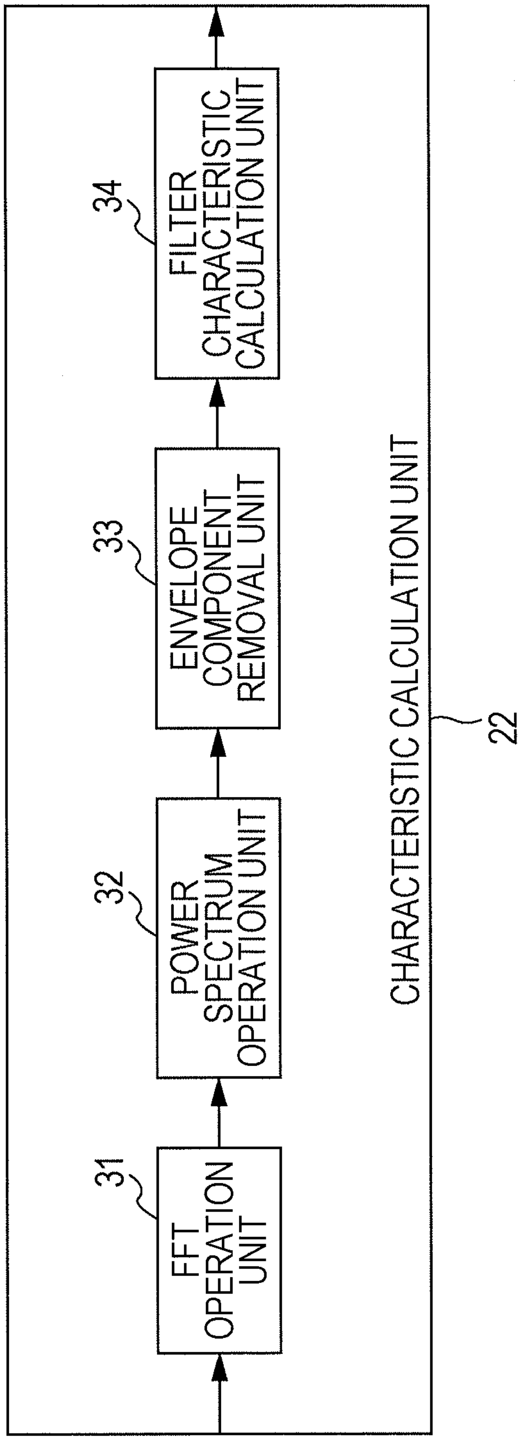
FIG. 2 is a block diagram showing a detailed structure example of the characteristic calculation unit in FIG. 1.

FIG. 2 is a block diagram showing a detailed structure example of the characteristic calculation unit 22 in FIG. 1.

The characteristic calculation unit 22 in FIG. 2 includes an FFT (fast Fourier transform) operation unit 31, a power spectrum operation unit 32, an envelope component removal unit 33, and a filter characteristic calculation unit 34. The characteristic calculation unit 22 processes the audio signal supplied from the microphone 11 on a frame-by-frame basis.

The FFT operation unit 31 converts the audio signal that is a time domain signal into a frequency domain signal by performing FFT operation on the audio signal supplied from the microphone 11. The FFT operation unit 31 supplies the frequency domain signal to the power spectrum operation unit 32.

The power spectrum operation unit 32 calculates the absolute squared value of the frequency domain signal supplied from the FFT operation unit 31 to obtain a power spectrum. The power spectrum operation unit 32 supplies the power spectrum to the envelope component removal unit 33.

The envelope component removal unit 33 removes the envelope component from the power spectrum supplied by the power spectrum operation unit 32 to generate the signal characteristic that represents the peakness of the power spectrum. The envelope component removal unit 33 supplies the signal characteristic to the filter characteristic calculation unit 34.

The filter characteristic calculation unit 34 calculates the filter characteristic for suppressing the signal characteristic by using the signal characteristic supplied from the envelope component removal unit 33. Specifically, the filter characteristic calculation unit 34 calculates the filter characteristic using any one of expressions (1) to (3) below.

$$l(f) = -\alpha \cdot p(f) \quad (1)$$

$$l(f) = \begin{cases} 0, & p(f) < 0 \\ -\alpha \cdot p(f), & p(f) \geq 0 \end{cases} \quad (2)$$

$$l(f) = 20\log_{10}\left(\frac{1 + 10^{\frac{p(f)}{20}}}{2 \cdot 10^{\frac{p(f)}{20}}}\right) \quad (3)$$

In expressions (1) to (3), p(f) represents the signal characteristic, I(f) represents the filter characteristic, and α is a coefficient that determines the gain of the suppress filter 21.

[Explanation of Signals in the Characteristic Calculation Unit]

FIGS. 3A to 4C show signals in the character calculation unit 22 in FIG. 2.

In FIGS. 3A to 4C, the horizontal axis represents the frequency (f) and the vertical axis represents the level (dB) of the audio signal.

Figure 3A:
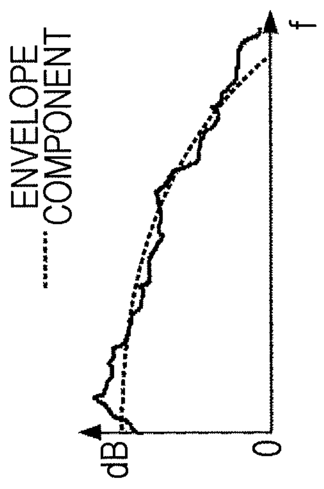
FIGS. 3A to 3C show signals in the character calculation unit in FIG. 2.
Figure 3B:
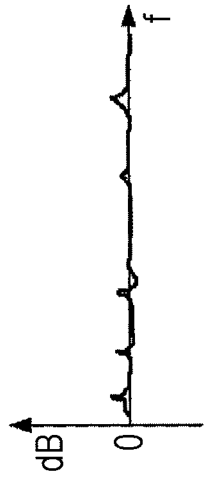

In the envelope component removal unit 33 of the character calculation unit 22 in FIG. 2, the envelope component indicated by the dotted line in FIG. 3A is removed from the power spectrum indicated by the solid line in FIG. 3A to generate the signal characteristic in FIG. 3B.

Figure 3C:
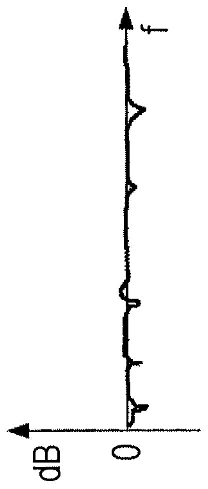

Then, the filter characteristic calculation unit 34 performs, for example, the operation (α=1) of expression (1) using the signal characteristic in FIG. 3B to calculate the filter characteristic in FIG. 3C.

A method of removing the envelope component is, for example, to use a cepstrum.

Figure 4A:
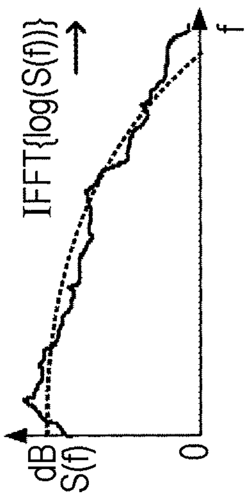
FIGS. 4A to 4C show signals in the characteristic calculation unit in FIG. 2.
Figure 4B:
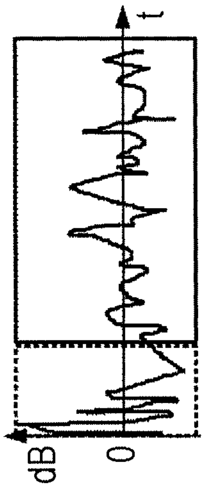

In this method, IFFT (inverse fast Fourier transform) is first performed on the logarithm (log S(f)) of the power spectrum S(f) indicated by the solid line in FIG. 4A and the power spectrum is converted into the cepstrum in FIG. 4B.

Figure 4C:
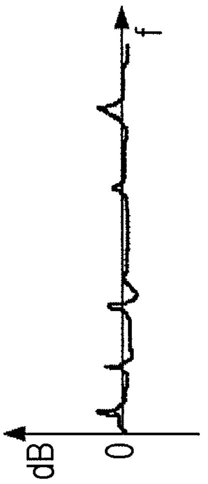

Next, of the cepstrum in FIG. 4B, the low-order components within the frame of the dotted line, which are the envelope components, are set to 0 dB and the high-order components within the frame of the solid line are left unchanged. Then, FFT operation is performed on the resulting cepstrum. This generates the power spectrum from which the envelope components in FIG. 4C are removed as the signal characteristic.

[Explanation of Processing Performed by the Characteristic Calculation Unit]

Figure 5:
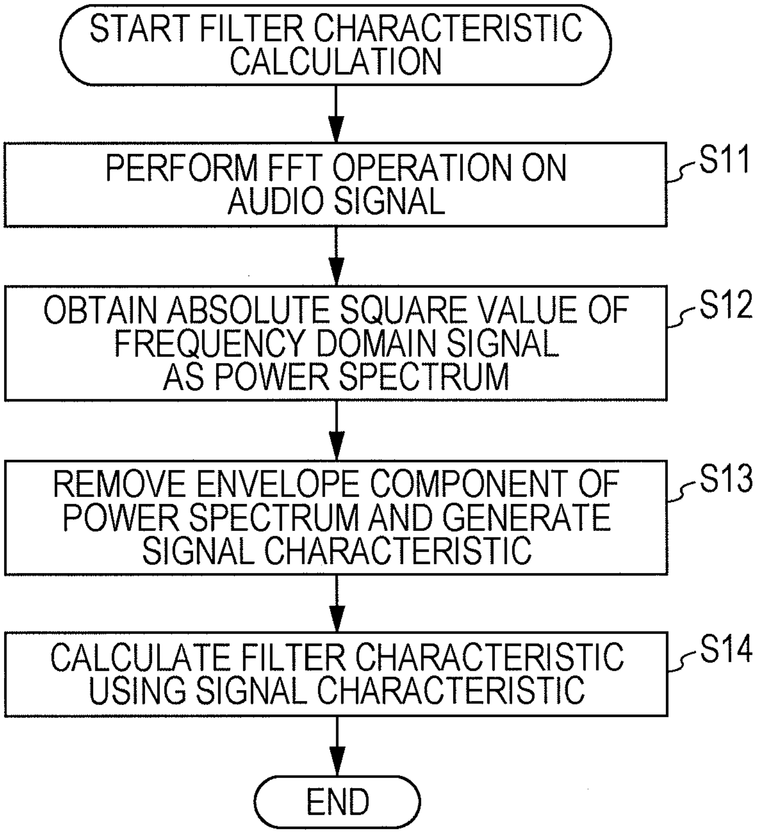
FIG. 5 is a flowchart showing filter characteristic calculation performed by the characteristic calculation unit in FIG. 2.

FIG. 5 is a flowchart showing filter characteristic calculation performed by the characteristic calculation unit 22 in FIG. 2. The filter characteristic calculation is performed on the audio signal supplied from, for example, the microphone 11, on a frame-by-frame basis.

In step S11 in FIG. 5, the FFT operation unit 31 converts the audio signal that is a time domain signal into a frequency domain signal by performing FFT operation on the audio signal supplied from the microphone 11. The FFT operation unit 31 supplies the frequency domain signal to the power spectrum operation unit 32.

In step S12, the power spectrum operation unit 32 calculates the absolute squared value of the frequency domain signal supplied from the FFT operation unit 31 to obtain a power spectrum. The power spectrum operation unit 32 supplies the power spectrum to the envelope component removal unit 33.

In step S13, the envelope component removal unit 33 removes the envelope component from the power spectrum supplied by the power spectrum operation unit 32 to generate the signal characteristic. The envelope component removal unit 33 supplies the signal characteristic to the filter characteristic calculation unit 34.

In step S14, the filter characteristic calculation unit 34 calculates the filter characteristic by performing any one of expressions (1) to (3) with the signal characteristic supplied from the envelope component removal unit 33. Then, the processing ends.

As described above, the sound processing unit 10 obtains the power spectrum of the audio signal, generates the signal characteristic by removing the envelope component of the power spectrum, calculates the filter characteristic used to suppress and flat the signal characteristic by using the signal characteristic, and filters the audio signal using the filter characteristic.

Accordingly, howling can be gradually prevented from occurring before it occurs in response to the sign of occurrence. In addition, the suppress filter 21 is updated adaptively with the signal characteristic of the audio signal, so it is possible to suppress the gain of the audio signal of a frequency whose suppression is necessary. As described above, howling can be suppressed at high accuracy.

[Another Detailed Structure Example of the Characteristic Calculation Unit]

Figure 6:
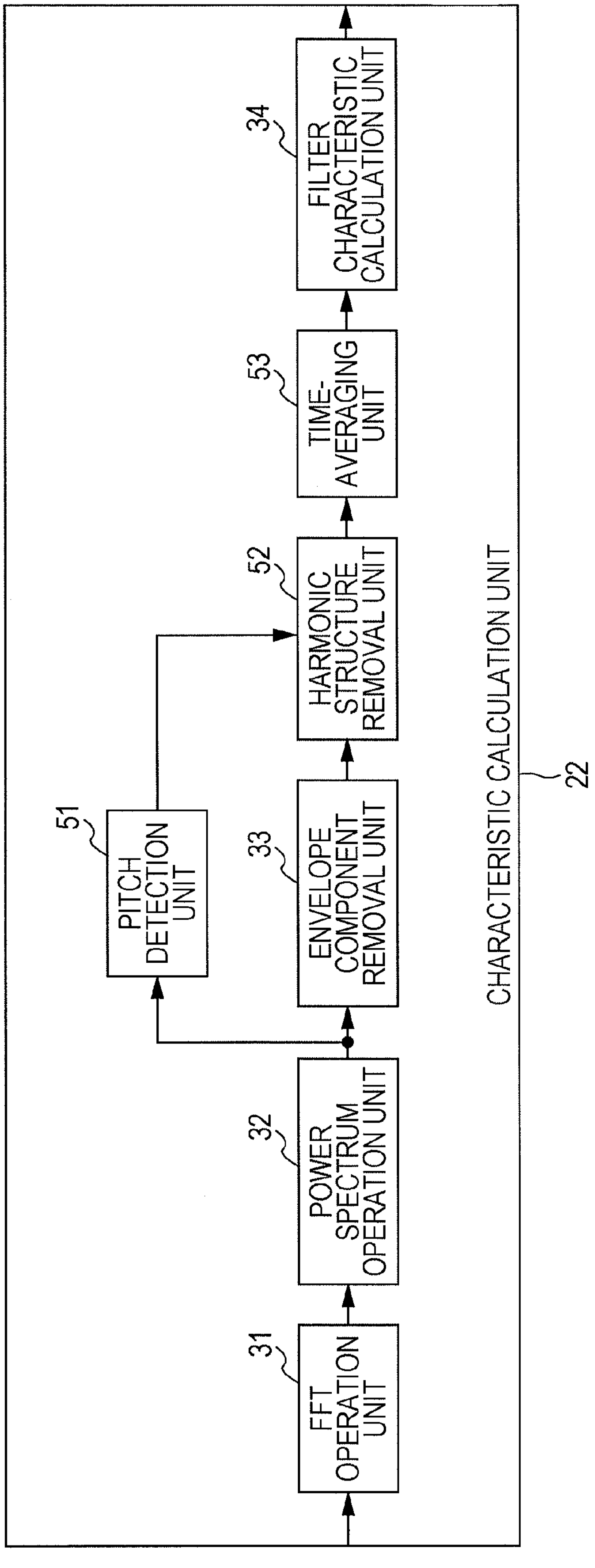
FIG. 6 is a block diagram showing another detailed structure example of the characteristic calculation unit in FIG. 1.

FIG. 6 is a block diagram showing another detailed structure example of the characteristic calculation unit 22 in FIG. 1.

In the structure in FIG. 6, the same components as in FIG. 2 have the same reference numerals. Redundant descriptions are omitted as appropriate.

Unlike the structure in FIG. 2, the characteristic calculation unit 22 in FIG. 6 has a pitch detection unit 51, a harmonic structure removal unit 52, and a time-averaging unit 53. The characteristic calculation unit 22 in FIG. 6 calculates the filter characteristic for time-averaging the signal characteristic from which the components of frequencies that are positive integer multiples of a sound pitch are removed and for suppressing the resulting signal characteristic.

The pitch detection unit 51 performs IFFT operation on the logarithm of the power spectrum output from the power spectrum operation unit 32 to convert the power spectrum into a cepstrum. The pitch detection unit 51 detects the highest peak in a range (for example, 3.3 ms to 15 ms) corresponding to the frequencies at which the sound pitch of the cepstrum can exist and adopts the frequency for the peak as a candidate for the sound pitch. The pitch detection unit 51 obtains the ratio between the candidate for the pitch and the zero order cepstrum of the process target frame and, if the ratio is equal to or more than the threshold, adopts the candidate for the pitch as the pitch. The pitch detection unit 51 supplies the pitch to the harmonic structure removal unit 52.

The harmonic structure removal unit 52 determines whether the signal characteristic output by the envelope component removal unit 33 has a harmonic structure in which peaks exist at frequencies that are positive integer multiples of the pitch supplied from the pitch detection unit 51.

If the harmonic structure removal unit 52 detects that the signal characteristic has this harmonic structure, the harmonic structure removal unit 52 determines the components of frequencies of the signal characteristic that are positive integer multiples of the signal characteristic pitch to be sound components and sets the components to 0 dB. That is, the components for the pitch of the signal characteristic and the higher harmonic components of the pitch are set to 0 dB. Then, the harmonic structure removal unit 52 supplies the resulting signal characteristic to the time-averaging unit 53. The components to be set to 0 dB by the harmonic structure removal unit 52 may include the components of peripheral frequencies in addition to the higher harmonic components of the pitch.

The time-averaging unit 53 holds the signal characteristic supplied from the harmonic structure removal unit 52. The time-averaging unit 53 time-averages the signal characteristic using the signal characteristic of the process target frames supplied from the harmonic structure removal unit 52 and the signal characteristic of past frames.

For example, the time-averaging unit 53 time-averages the signal characteristic $I_n(f)$ using the following expression (4) together with the signal characteristic $I_n(f)$ of the process target frame and the signal characteristic $I_{n-1}(f)$ of the frame one frame before the process target frame. In expression (4), β represents a coefficient.

$$I_n(f)=I_{n-1}(f)\times\beta+I_n(f)\times(1-\beta)$$

$$0\leqq\beta\leqq 1 \quad (4)$$

According to expression (4), the signal characteristic $I_n(f)$ of the process target frame after time-averaging is represented by the weighted sum of the signal characteristic $I_n(f)$ of the process target frame and the signal characteristic $I_{n-1}(f)$ of the frame one frame before the process target frame.

Expression (4) is used for low-order IIR type time-averaging, but the time-averaging unit 53 can perform high-order IIR or FIR type time-averaging or non-linear time-averaging in addition to low-order IIR type time-averaging.

The time-averaging unit 53 supplies the time-averaged signal characteristic to the filter characteristic calculation unit 34. This calculates the filter characteristic for suppressing the time-averaged signal characteristic.

[Explanation of Signals in the Characteristic Calculation Unit]

Figure 7A:
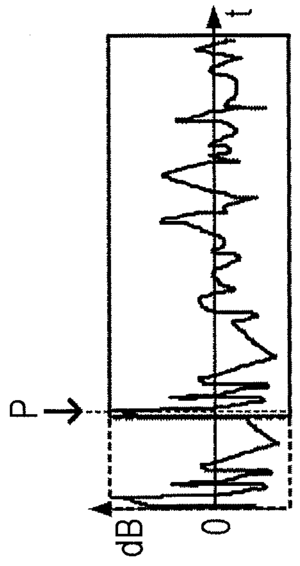
FIGS. 7A to 7C show signals in the characteristic calculation unit in FIG. 6.
Figure 7B:
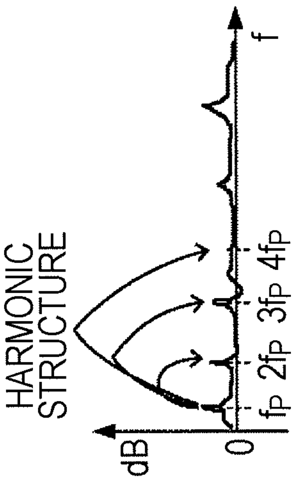
Figure 7C:
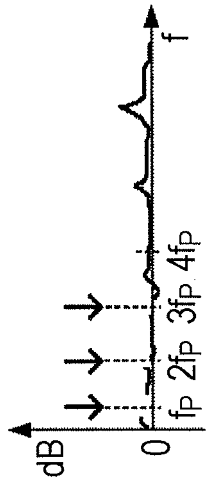

FIG. 7A to 7C show signals in the characteristic calculation unit 22 in FIG. 6.

In the pitch detection unit 51 of the characteristic calculation unit 22 in FIG. 6, IFFT operation is performed on the logarithm of the power spectrum to convert the power spectrum into a cepstrum in FIG. 7A. The highest peak P is detected in the range of frequencies at which the sound pitch of the cepstrum can exist, the range being indicated by the frame of a solid line in FIG. 7A, and frequency $f_P$ of the peak P is adopted as a candidate for a sound pitch. Then, the ratio between the candidate for the sound pitch and the zero order cepstrum is obtained. In the example in FIGS. 7A to 7C, the ratio is equal to or more than the threshold and frequency $f_P$, which is a candidate for a pitch, is adopted as the sound pitch.

The harmonic structure removal unit 52 detects the components of frequencies $f_P$, $2f_P$, $3f_P$, $4f_P$ . . . of the signal characteristic in FIG. 7B that are positive integer multiples of the sound pitch. When the components have peaks as shown in FIG. 7B, the signal characteristic is detected to have a pitch harmonic structure and the components are set to 0 dB. As a result, the signal characteristic shown in FIG. 7C is obtained.

[Explanation of Processing in the Characteristic Calculation Unit]

Figure 8:
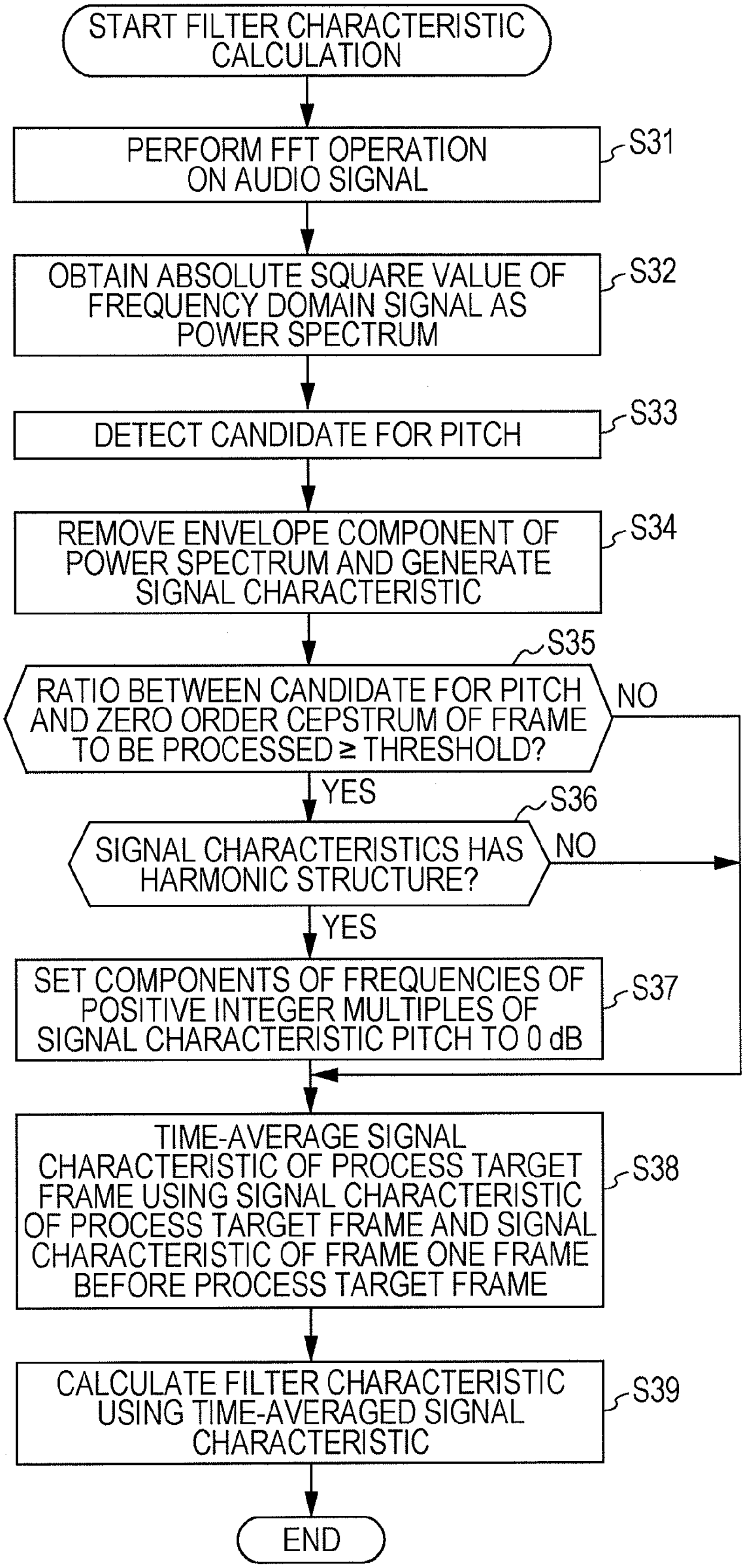
FIG. 8 is a flowchart showing filter characteristic calculation performed by the characteristic calculation unit in FIG. 6.

FIG. 8 is a flowchart showing filter characteristic calculation performed by the characteristic calculation unit 22 in FIG. 6. This filter characteristic calculation is performed on, for example, an audio signal supplied from the microphone 11 on a frame-by-frame basis.

In step S31 in FIG. 8, the FFT operation unit 31 converts the audio signal that is a time domain signal into a frequency domain signal by performing FFT operation on the audio signal supplied from the microphone 11. Then, the FFT operation unit 31 supplies the frequency domain signal to the power spectrum operation unit 32.

In step S32, the power spectrum operation unit 32 calculates the absolute squared value of the frequency domain signal supplied from the FFT operation unit 31 to obtain a power spectrum. The power spectrum operation unit 32 supplies the power spectrum to the envelope component removal unit 33 and the pitch detection unit 51.

In step S33, the pitch detection unit 51 detects a candidate for the pitch using the power spectrum supplied from the power spectrum operation unit 32. Specifically, the pitch detection unit 51 performs IFFT operation on the logarithm of the power spectrum to convert the power spectrum into a cepstrum. The pitch detection unit 51 detects the highest peak in a range corresponding to the frequencies at which the sound pitch of the cepstrum can exist and adopts the frequency for the peak as a candidate for the pitch of sound.

In step S34, the envelope component removal unit 33 removes the envelope component from the power spectrum supplied by the power spectrum operation unit 32 to generate the signal characteristic. The envelope component removal unit 33 supplies the signal characteristic to the filter characteristic calculation unit 34.

In step S35, the pitch detection unit 51 determines whether the ratio between the candidate for the pitch and the zero order cepstrum of the process target frame is equal to or more than the threshold. If the ratio is equal to or more than the threshold in step S35, the pitch detection unit 51 adopts the candidate as the pitch and supplies it to the harmonic structure removal unit 52.

In step S36, the harmonic structure removal unit 52 determines whether the signal characteristic supplied by the envelope component removal unit 33 has a harmonic structure in which peaks exist at frequencies that are positive integer multiples of the pitch supplied from the pitch detection unit 51.

If the signal characteristic is determined to have the harmonic structure for the pitch in step S36, the harmonic structure removal unit 52 sets the components of frequencies of the signal characteristic that are positive integer multiples of the pitch to 0 dB in step S37. Then, the harmonic structure removal unit 52 supplies the resulting signal characteristic to the time-averaging unit 53 and the processing proceeds to step S38.

If the ratio between the candidate for the pitch and the zero order cepstrum of the process target frame is determined to be less than the threshold in step S35 or if the signal characteristic does not have the harmonic structure of the pitch in step S36, the harmonic structure removal unit 52 supplies the signal characteristic generated by the envelope component removal unit 33 to the time-averaging unit 53 as is. The processing proceeds to step S38.

In step S38, the time-averaging unit 53 time-averages the signal characteristic of the process target frame supplied from the harmonic structure removal unit 52 using the above expression (4) together with the signal characteristic of the process target frame and the signal characteristic of the frame one frame before the process target frame.

In step S39, the filter characteristic calculation unit 34 calculates the filter characteristic using the time-averaged characteristic signal supplied from the time-averaging unit 53 and supplies the result to the suppress filter 21 (FIG. 1). Then, the processing ends.

As described above, in the sound processing unit 10 having the characteristic calculation unit 22 in FIG. 6, the suppress filter 21 performs filtering using the filter characteristic corresponding to the time-averaged signal characteristic, so an audio signal and other signals that change sharply are not suppressed and the quality of sound output from the speaker 14 is improved.

In addition, the sound processing unit 10 having the characteristic calculation unit 22 in FIG. 6 detects a sound pitch and calculates the filter characteristic by using the signal characteristic in which the components of frequencies that are positive integer multiples of the pitch are set to 0 dB, so the harmonic structure of the sound pitch is not lost in the suppress filter 21. As a result, the quality of sound output from the speaker 14 is improved.

[Explanation of a Computer According to the Embodiment of the Present Invention]

The series of processes described above can be implemented by hardware or software. When the series of processes are implemented by software, the programs constituting the software are installed in general-purpose computer etc.

Figure 9:
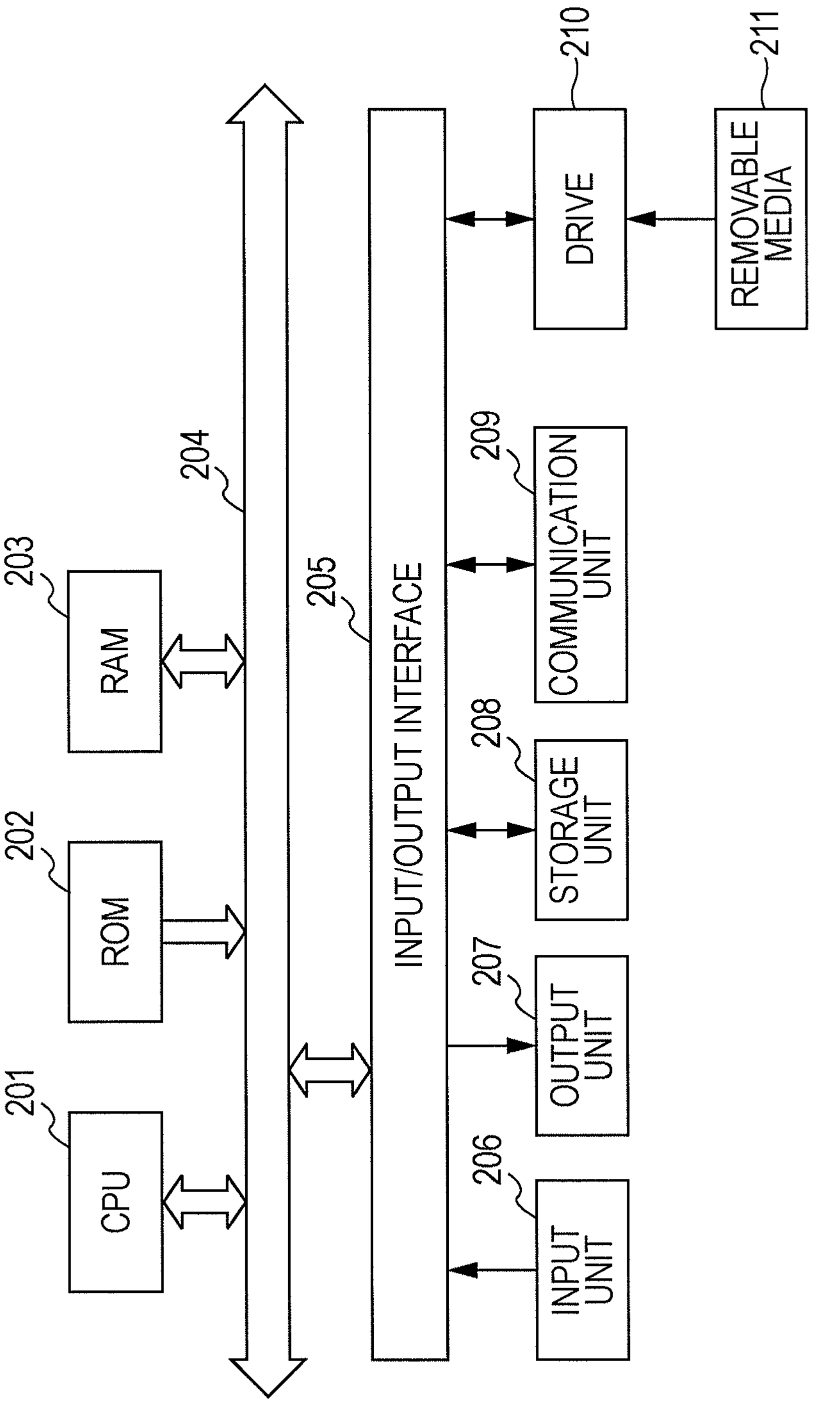
FIG. 9 is a block diagram showing a structure example of an embodiment of a computer.

FIG. 9 shows a structure example of an embodiment of the computer in which the programs for performing the series of processes are installed.

The programs can be stored in advance in a storage unit 208 or a ROM (read only memory) 202, which are built-in storage media in the computer.

The programs can also be stored (recorded) on a removable media 211. This type of the removable media 211 can be provided as so-called package software. Examples of the removable media 211 are a flexible disc, CD-ROM (compact disc read only memory), MO (magneto optical) disc, DVD (digital versatile disc), magnetic disc, and semiconductor memory.

The programs can be installed in the computer from the removal media 211 through a drive 210 or can be installed in the storage unit 208 by downloading them to the computer through a communication network or broadcast network. That is, the programs can be transferred wirelessly to the computer through an artificial satellite for digital satellite broadcasting from the download site or transferred to the computer through a network such as LAN (local area network) or the Internet.

The computer incorporates a CPU (central processing unit) 201 to which an input/output interface 205 is connected through a bus 204.

When the user enters an instruction by operating an input unit 206 through the input/output interface 205, the CPU 201 executes the programs stored in the ROM 202 according to the instruction. Alternatively, the CPU 201 executes the programs stored in the storage unit 208 by loading them to a RAM (random access memory) 203.

This lets the CPU 201 execute the processing according to the above flowchart or the processing performed by the structure in the above block diagram. Then, the CPU 201 outputs the processing result to an output unit 207, transmits the processing result from the communication unit 209, or stores the processing result in the storage unit 208 through the input/output interface 205, if necessary.

The input unit 206 includes a keyboard, a mouse, and a microphone. The output unit 207 includes a LCD (liquid crystal display) and a speaker.

In this specification, it is not necessary for the computer to follow the sequence of the flowchart in chronological order during processing according to the program. That is, the processing performed by the computer according to the program includes processing performed in parallel or individually (for example, parallel processing or processing by an object).

The programs may be processed by one computer (processor) or processed in a distributed manner by a plurality of computers. The programs may be transferred to a remote computer to be executed.

The present application contains subject matter related to that disclosed in Japanese Priority Patent Application JP 2009-238366 filed in the Japan Patent Office on Oct. 15, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A sound processing apparatus comprising:

a power spectrum operation means for obtaining a power spectrum of an audio signal;

a pitch detection means for identifying zero or more potential pitches from the power spectrum;

an envelope component removal means for removing an envelope component of the power spectrum and generating a signal characteristic that represents a peakness of the power spectrum;

a harmonic structure removal means for removing components of frequencies of the signal characteristic that are equal or close to positive integer multiples of a potential pitch when (1) a potential pitch exceeds a processing threshold, and (2) the signal characteristic has a harmonic structure;

a time averaging means for generating a time-averaged signal characteristic by averaging the signal characteristic and one or more prior signal characteristics obtained at earlier times from a same input channel;

a filter characteristic calculation means for calculating a filter characteristic suppressing the signal characteristic by using the time-averaged signal characteristic; and a suppress filter for filtering the audio signal by using the filter characteristic, wherein the sound processing apparatus suppresses howling.

2. A sound processing method included in a sound processing unit, the method comprising the steps of:

obtaining a power spectrum of an audio signal;

identifying zero or more potential pitches from the power spectrum;

removing an envelope component of the power spectrum and generating a signal characteristic representing a peakness of the power spectrum;

removing components of frequencies of the signal characteristic that are equal or close to positive integer multiples of a potential pitch when (1) a potential pitch exceeds a processing threshold, and (2) the signal characteristic has a harmonic structure;

generating a time-averaged signal characteristic by averaging the signal characteristic and one or more prior signal characteristics obtained at earlier times from a same input channel;

calculating a filter characteristic for suppressing the signal characteristic by using the time-averaged signal characteristic; and filtering the audio signal by using the filter characteristic, wherein the sound processing method suppresses howling.

3. A non-transitory, computer-readable storage medium storing a computer program that lets one or more computers perform processing comprising the steps of:

obtaining a power spectrum of an audio signal;

identifying zero or more potential pitches from the power spectrum;

removing an envelope component of the power spectrum and generating a signal characteristic representing a peakness of the power spectrum;

removing components of frequencies of the signal characteristic that are equal or close to positive integer multiples of a potential pitch when (1) a potential pitch exceeds a processing threshold, and (2) the signal characteristic has a harmonic structure;

generating a time-averaged signal characteristic by averaging the signal characteristic and one or more prior signal characteristics obtained at earlier times from a same input channel;

calculating a filter characteristic for suppressing the signal characteristic by using the time-averaged signal characteristic; and filtering the audio signal by using the filter characteristic, wherein the processing suppresses howling.

4. A sound processing apparatus comprising:

a power spectrum operation unit for obtaining a power spectrum of an audio signal;

a pitch detection unit for identifying zero or more potential pitches from the power spectrum;

an envelope component removal unit for removing an envelope component of the power spectrum and generating a signal characteristic that represents a peakness of the power spectrum;

a harmonic structure removal unit for removing components of frequencies of the signal characteristic that are equal or close to positive integer multiples of a potential pitch when (1) a potential pitch exceeds a processing threshold, and (2) the signal characteristic has a harmonic structure;

a time averaging unit for generating a time-averaged signal characteristic by averaging the signal characteristic and one or more prior signal characteristics obtained at earlier times from a same input channel;

a filter characteristic calculation unit for calculating a filter characteristic that suppresses the signal characteristic by using the time-averaged signal characteristic; and a suppress filter for filtering the audio signal by using the filter characteristic, wherein the sound processing apparatus suppresses howling.

5. The sound processing apparatus according to claim 1, wherein an amplifier amplifies a signal from the suppress filter and supplies it to a speaker.

6. The sound processing apparatus according to claim 1, wherein the sound processing apparatus processes the audio signal on a frame-by-frame basis.

7. The sound processing apparatus according to claim 1, wherein the envelope component removal means removes the envelope component of the power spectrum by using a cepstrum.

8. The sound processing apparatus according to claim 1, wherein the suppress filter is updated adaptively with a signal from the filter characteristic calculation means.

9. The sound processing apparatus according to claim 1, wherein the harmonic structure removal means further removes components of frequencies of the signal characteristic that are peripheral to positive integer multiples of the potential pitch when (1) the potential pitch exceeds the processing threshold, and (2) the signal characteristic has a harmonic structure.

10. The sound processing apparatus according to claim 1, wherein the time-averaging means is by at least one of (1) low-order IIR (infinite impulse response), (2) high-order IIR (infinite impulse response), (3) FIR (finite impulse response), or (4) non-linear time-averaging means.

11. The sound processing method according to claim 2 further comprising amplifying the audio signal and supplying it to a speaker.

12. The sound processing method according to claim 2 further comprising processing the audio signal on a frame-by-frame basis.

13. The sound processing method according to claim 2, wherein removing the envelope component of the power spectrum occurs by using a cepstrum.

14. The sound processing method according to claim 2, wherein filtering the audio signal by using the filter characteristic is done adaptively.

15. The sound processing method according to claim 2 further comprising removing components of frequencies of the signal characteristic that are peripheral to positive integer multiples of the potential pitch when (1) the potential pitch exceeds the processing threshold, and (2) the signal characteristic has a harmonic structure.

16. The sound processing method according to claim 2, wherein generating a time-averaged signal characteristic occurs by at least one of (1) low-order IIR (infinite impulse response), (2) high-order IIR (infinite impulse response), (3) FIR (finite impulse response), or (4) non-linear time-averaging means.

17. A non-transitory, computer-readable storage medium as in claim 3, wherein the processing is serial.

18. A non-transitory, computer-readable storage medium as in claim 3, wherein the processing is parallel.

19. A non-transitory, computer-readable storage medium as in claim 3, wherein the one or more computers perform the processing remotely.

* * * * *